United States Patent
Dhindsa et al.

[11] Patent Number: 6,039,836
[45] Date of Patent: Mar. 21, 2000

[54] FOCUS RINGS

[75] Inventors: Rajinder Dhindsa, Milpitas; Vikram Singh, Santa Clara; Ken Tokunaga, Fremont, all of Calif.

[73] Assignee: LAM Research Corporation, Fremont, Calif.

[21] Appl. No.: 08/993,791

[22] Filed: Dec. 19, 1997

[51] Int. Cl.[7] ............................. C23C 16/50; H05H 1/00
[52] U.S. Cl. ............... 156/345; 118/723 E; 204/298.02; 204/298.31
[58] Field of Search ..................... 118/723 E; 156/345; 204/298.02, 298.31

[56] References Cited

U.S. PATENT DOCUMENTS 5,474,649  12/1995  Kava et al. ........................ 156/345 X
5,556,500   9/1996  Hasegawa et al. .................... 156/345

FOREIGN PATENT DOCUMENTS

525633A1  2/1993  European Pat. Off. .
663682A1  7/1995  European Pat. Off. .

OTHER PUBLICATIONS

Hongching Shan, et al., "Process kit and wafer temperature effects on dielectric etch rate and uniformity of electrostatic chuck," Jul. 11, 1995, J. Vac. Sci. Technol. B 14(1), Jan./Feb. 1996, pp. 521–526.
International Searching Authority/EPO, International Search Report, Apr. 15, 1999.

*Primary Examiner*—Leo B. Tentoni
*Attorney, Agent, or Firm*—Beyer Weaver Thomas & Nguyen, LLP

[57] ABSTRACT

An improved focus ring is configured for use in a plasma processing chamber. The focus ring is configured to overlap at least a portion of a substrate-holding chuck that is powered by radio frequency (RF) power during plasma operation to act as an electrode. The focus ring includes an upper surface that is exposed to a plasma region within the plasma processing chamber during the plasma operation. The focus ring further includes a chuck-overlapping portion that overlaps the portion of the substrate-holding chuck, at least a portion of the chuck-overlapping portion being formed of a first material having a lower dielectric constant than a remainder of the focus ring.

9 Claims, 6 Drawing Sheets

FOCUS RINGS

BACKGROUND OF THE INVENTION

The present invention relates to the manufacture of semiconductor-based products. More particularly, the present invention relates to improved focus rings in plasma processing systems and methods therefor.

The use of plasma-enhanced processes in the manufacture of semiconductor-based products (such as integrated circuits or flat panel displays) is well known. Generally speaking, plasma-enhanced processes involve the processing of a substrate (e.g., a glass panel or a semiconductor wafer) in a plasma processing chamber. Within the plasma processing chamber, a plasma may be ignited out of appropriate etchant or deposition source gases to respectively etch or deposit a layer of material on the surface of the substrate.

To facilitate discussion, FIG. 1 illustrates a simplified inductively coupled plasma processing system, representing a suitable plasma processing system for performing plasma-enhanced processes on substrates. To simplify the illustration, FIG. 1 as well as the figures herein has not been drawn to scale. It should be borne in mind, however, that although an inductively-coupled plasma processing system is discussed in detail in this disclosure, the invention disclosed herein may be employed in any known plasma processing system, including processing systems adapted for deposition, cleaning, and/or etching. With respect to etching systems, the invention may be employed in, for example, inductively-coupled plasma etching, dry etching, reactive ion etching (RIE), magnetically enhanced reactive ion etching (MERIE), electron cyclotron resonance (ECR) etching, or the like. Note that the above is true irrespective of whether energy to the plasma is delivered through capacitively coupled parallel electrode plates, through ECR microwave plasma sources, or through inductively coupled RF sources such as helicon, helical resonators, and coil arrangements (whether planar or nonplanar). ECR and inductively coupled plasma processing systems, among others, are readily available commercially. Inductively coupled plasma systems, such as the TCP™ brand inductively coupled plasma systems, are available from Lam Research Corporation of Fremont, Calif.

Referring now to FIG. 1, a plasma processing system 100 includes a plasma processing chamber 102. Above chamber 102, there is disposed an electrode 104, which is implemented by a coil in the example of FIG. 1. Electrode 104 is energized by a radio frequency (RF) generator 106 via a conventional matching network 108. In the example of FIG. 1, RF generator 106 sources RF energy having a frequency of about 13.56 MHz although other appropriate frequencies may also be employed.

Within plasma processing chamber 102, there is shown a shower head 110, representing the gas distribution apparatus for releasing gaseous etchant or deposition source gases into a region 112 between itself and a substrate 114. Substrate 114 is introduced into plasma processing chamber 102 and disposed on a substrate-holding chuck 116, which may be implemented as an electrostatic (ESC) chuck (either monopolar or bipolar in configuration). Chuck 116 may also be a mechanical chuck, a vacuum chuck, or simply a workpiece holder. Chuck 116 acts as the second electrode and is biased by a radio frequency (RF) generator 118 via a matching network 120. Like RF generator 106, RF generator 118 of the example of FIG. 1 also sources RF energy having a frequency of about 13.56 MHz although other suitable frequencies may be employed as well.

To facilitate plasma-enhanced processing, the etchant or deposition source gas is flowed through the shower head 110 and ignited by the RF energy supplied by RF generators 106 and 118. During plasma-enhanced processing, the by-product gases are exhausted out of chamber 102 through exhaust port 122 (using an appropriate turbo pump arrangement). After plasma-enhanced processing is completed, substrate 114 is removed from plasma processing chamber 102 and may undergo additional processing steps to form the completed flat panel display or integrated circuit.

In FIG. 1, a focus ring 124 is also shown. In the example of FIG. 1, a portion of focus ring 124 underlies substrate 114 and overlaps a portion of substrate-holding chuck 116. As is well known to those familiar with the plasma processing art, the focus ring helps focus the ions from the RF-induced plasma region 112 onto the surface of substrate 114 to improve process uniformity, particularly at the edge of the substrate. This is because when RF power is supplied to substrate-holding chuck 116 (from radio frequency generator 118), equipotential field lines are set up over substrate 114 and focus ring 124. These field lines are not static but change during the RF cycle. The time-averaged field results in the bulk plasma being positive and the surface of 114 and 116 negative. Due to geometry factors, the field lines are not uniform at the edge of substrate 114. The focus ring helps direct the bulk of the RF coupling through substrate 114 to the overlying plasma by acting as a capacitor between the plasma and the powered electrode (e.g., RF-powered chuck 116).

During plasma processing, the positive ions accelerate across the equipotential field lines (shown representatively in FIG. 1 as equipotential field lines 130) to impinge on the surface of substrate 114, thereby providing the desired processing effect (such as deposition or anisostropic etching). Although ion acceleration and impact upon substrate 114 are generally desirable if properly controlled, such ion acceleration and impact upon focus ring 124 tend to unduly erode focus ring 124. In the prior art, focus ring erosion is typically thought to be unavoidable. In the prior art, most of the attention is directed toward finding ways to minimize the effect such erosion causes (e.g., particulate contamination) on the process. By way of example, system designers in the prior art may form focus ring 124 out of a material generally similar to that employed to form the walls of plasma processing chamber or substrate 114 so that erosion does not introduce a different type of particulate contamination into the chamber. A popular material for use in forming focus ring 124 in the prior art is aluminum oxide ($Al_2O_3$).

As is known, however, aluminum oxide is a material with a relatively high dielectric constant, i.e., having relatively low impedance. Because of this, a relatively high potential difference exists between the upper surface 134 of focus ring 124 and the plasma sheath. This potential difference manifests itself by the presence of multiple equipotential field lines 130 along upper surface 134 of focus ring 124. The presence of multiple equipotential field lines over upper surface 134 causes the ions from RF-induced plasma region 112 to impinge with a relatively high level of force on upper surface 134 of focus ring 124 since ions tend to accelerate across equipotential field lines in a direction orthogonal to the field lines themselves.

Ion impact on upper surface 134 causes, in addition to the aforementioned contamination problem, other undesirable consequences. For example, if enough of focus ring 124 is eroded away by the impinging ions, the plasma material may begin to attack underlying chuck 116, which may give rise to more (and a different type of) particulate contamination and may eventually necessitate the replacement of chuck 116. Further, if chuck 116 is an electrostatic (ESC) chuck (i.e., a chuck that depends on electrostatic forces to clamp substrate 114 to its upper surface), current leakage to the plasma from the chuck (due to plasma directly contacting chuck 116 through eroded focus ring 124) may alter the ability of the ESC chuck to clamp substrate 114 to it. With inadequate clamping, the substrate may pop off the chuck during plasma processing or there may be inadequate heat transfer between the substrate and the chuck to ensure reliable processing results.

In view of the foregoing, there are desired improved techniques for reducing focus ring erosion in a plasma processing chamber.

SUMMARY OF THE INVENTION

The invention relates, in one embodiment, to a focus ring configured for use in a plasma processing chamber. The focus ring is configured to overlap at least a portion of a substrate-holding chuck that is powered by radio frequency (RF) power during plasma operation to act as an electrode. The focus ring includes an upper surface that is exposed to a plasma region within the plasma processing chamber during the plasma operation. The focus ring further includes a chuck-overlapping portion that overlaps the portion of the substrate-holding chuck, at least a portion of the chuck-overlapping portion being formed of a first material having a lower dielectric constant than a remainder of the focus ring.

In another embodiment, the invention relates to a focus ring configured for use in a plasma processing chamber. The focus ring is configured to overlap at least a portion of a substrate-holding chuck that is powered by radio frequency (RF) power during plasma operation to act as an electrode. The focus ring includes an upper surface that is exposed to a plasma region within the plasma processing chamber during the plasma operation. The focus ring also includes a chuck-overlapping portion that overlaps the portion of the substrate-holding chuck. The chuck-overlapping portion includes a conductive insert that overlies at least a portion of the portion of the substrate-holding chuck when the focus ring is installed in the plasma processing chamber.

In yet another embodiment, the invention relates to a method for reducing erosion of a focus ring that is configured for use in a plasma processing chamber. The focus ring has an upper surface configured to be exposed to plasma within the plasma processing chamber during plasma operation. The focus ring is also configured to overlap at least a portion of a substrate-holding chuck that is powered by radio frequency (RF) power during the plasma operation to act as an electrode. The method includes forming, in a chuck-overlapping portion of the focus ring, a lower dielectric constant portion having a lower dielectric constant than a different portion of the focus ring. In this focus ring, the chuck-overlapping portion overlaps the portion of the substrate-holding chuck.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
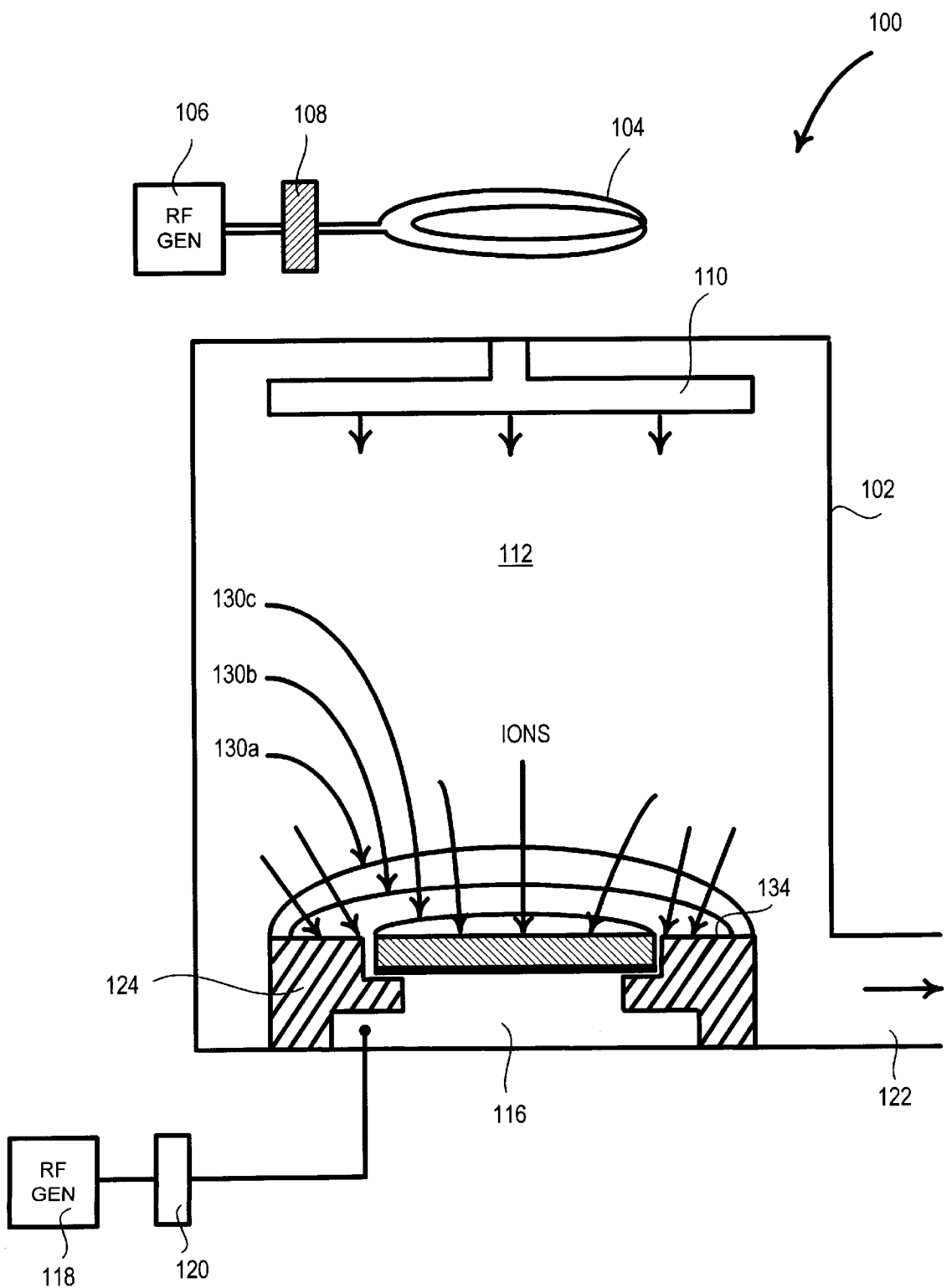
FIG. 1 illustrates a simplified inductively coupled plasma processing system, representing a suitable plasma processing system for performing plasma-enhanced processes on substrates.

In accordance with one aspect of the present invention, a focus ring is constructed such that equipotential field lines (e.g., equipotential field lines 130 of FIG. 1) are bent away from the upper surface of the focus ring to reduce the energy with which ions from the plasma impact focus ring 124. By reducing the number of equipotential field lines existing above the upper surface of the focus ring, the potential difference between the focus ring upper surface and the plasma is reduced, thereby reducing the energy with which ions impact the upper surface of the focus ring. With reduced ion impact, focus ring erosion is concomitantly reduced.

In one embodiment, at least a part of the focus ring that overlies the RF-powered chuck is formed of a low dielectric constant material or low dielectric constant region to increase the impedance between the underlying chuck to the plasma through the focus ring. With increasing impedance, a greater voltage drop is experienced from the chuck to the focus ring upper surface, thereby reducing the potential difference between the upper surface of the focus ring and the plasma to reduce the energy of the ions impinging thereon.

In general, the low dielectric constant material may be any type of suitable material (such as any suitable material having a lower dielectric constant than the prior art aluminum oxide). Such low dielectric constant material may include, for example, quartz, plastics (e.g., polyimid), boron nitride, aluminum nitride. In one embodiment, the low dielectric constant region in the focus ring may be implemented by a vacuum gap within the focus ring itself. In another embodiment, the entire focus ring may be formed of the low dielectric constant material.

In yet another embodiment, there is incorporated into the focus ring a grounded insert. The grounded insert is preferably disposed at least in the portion of the focus ring that overlies the chuck. The grounded insert advantageously bends the equipotential lines toward itself, thereby altering the contour of the equipotential lines away from the focus ring upper surface. As mentioned earlier, when fewer equipotential lines exist above the upper surface of the focus ring, the energy with which ions impinge on the upper surface of the focus ring is reduced, thereby reducing focus ring erosion.

Figure 2:
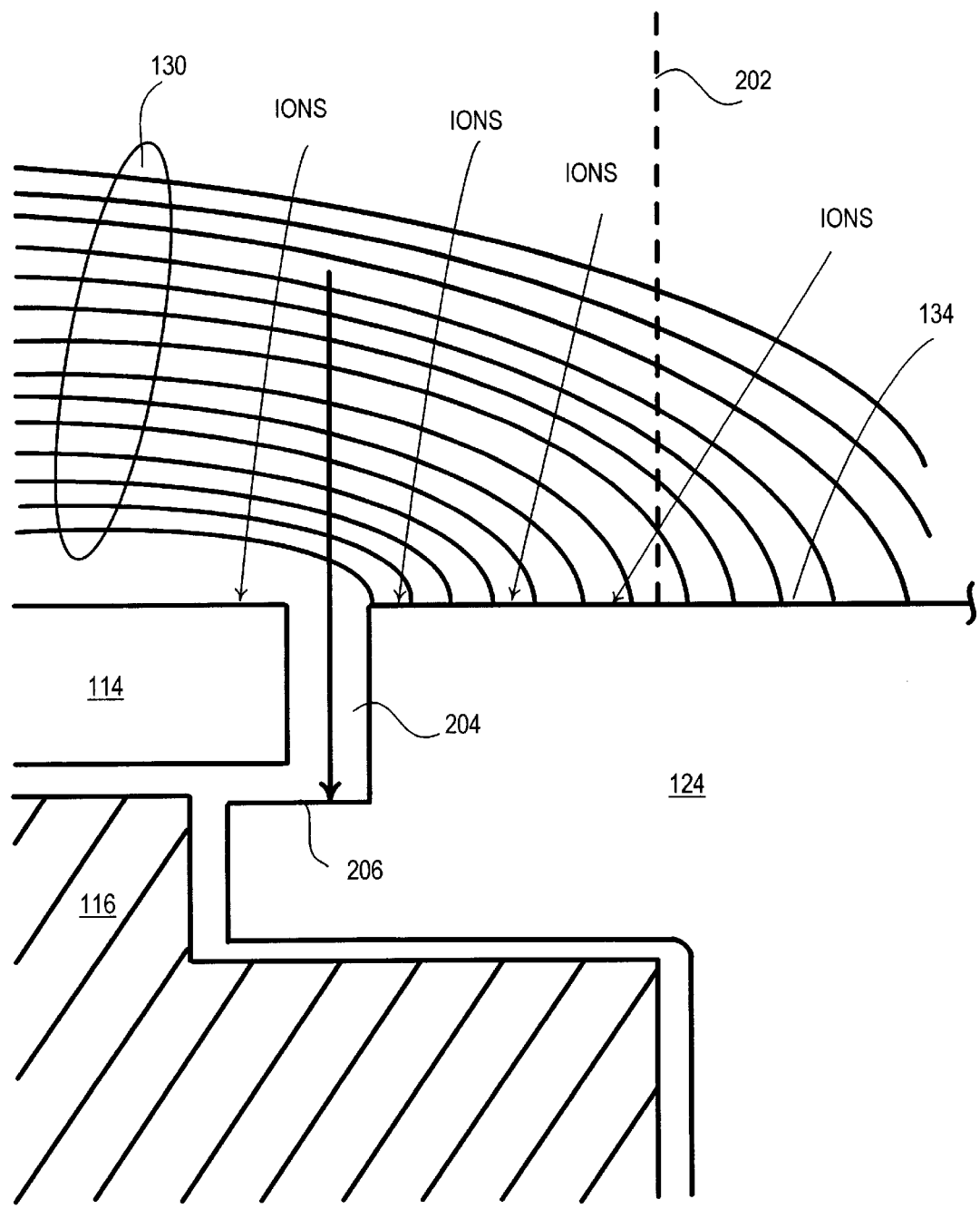
FIG. 2 depicts in greater detail a portion of the prior art focus ring as installed in the plasma processing system of FIG. 1.

To facilitate discussion of the features and advantages of the present invention, FIG. 2 depicts in greater detail a portion of prior art focus ring 124, chuck 116, and substrate 114. As shown in FIG. 2, focus ring 124 includes a portion that overlaps substrate-holding chuck 116 (i.e., the portion of focus ring 124 that is to the left of dash line 202 in FIG. 2). With the prior art aluminum oxide focus ring 124, equipotential field lines 130 remain substantially parallel to the portion of focus ring 124 that overlaps chuck 116 due to the relatively high dielectric constant of the aluminum oxide material. Consequently, ions from the plasma sheath accelerate perpendicularly to the equipotential field lines to toward upper surface 134 of focus ring 124 to impinge thereon and into gap 204 to impinge upon lower surface 206 of focus ring 124. As mentioned earlier, heavy bombardment of upper surface 134 and lower surface 206 gives rise to contamination issues and disadvantageously shortens the life of focus ring 124. Over time, the portion of the focus ring that overlaps chuck 116 may be eroded away, permitting ions to directly impinge on chuck 116, leading to chuck damage. Erosion will increase the gap between 114 and 206, which allows more residue from the plasma to deposit on chuck 116. Erosion also degrades the appearance of the focus ring leading to its replacement.

Figure 3:
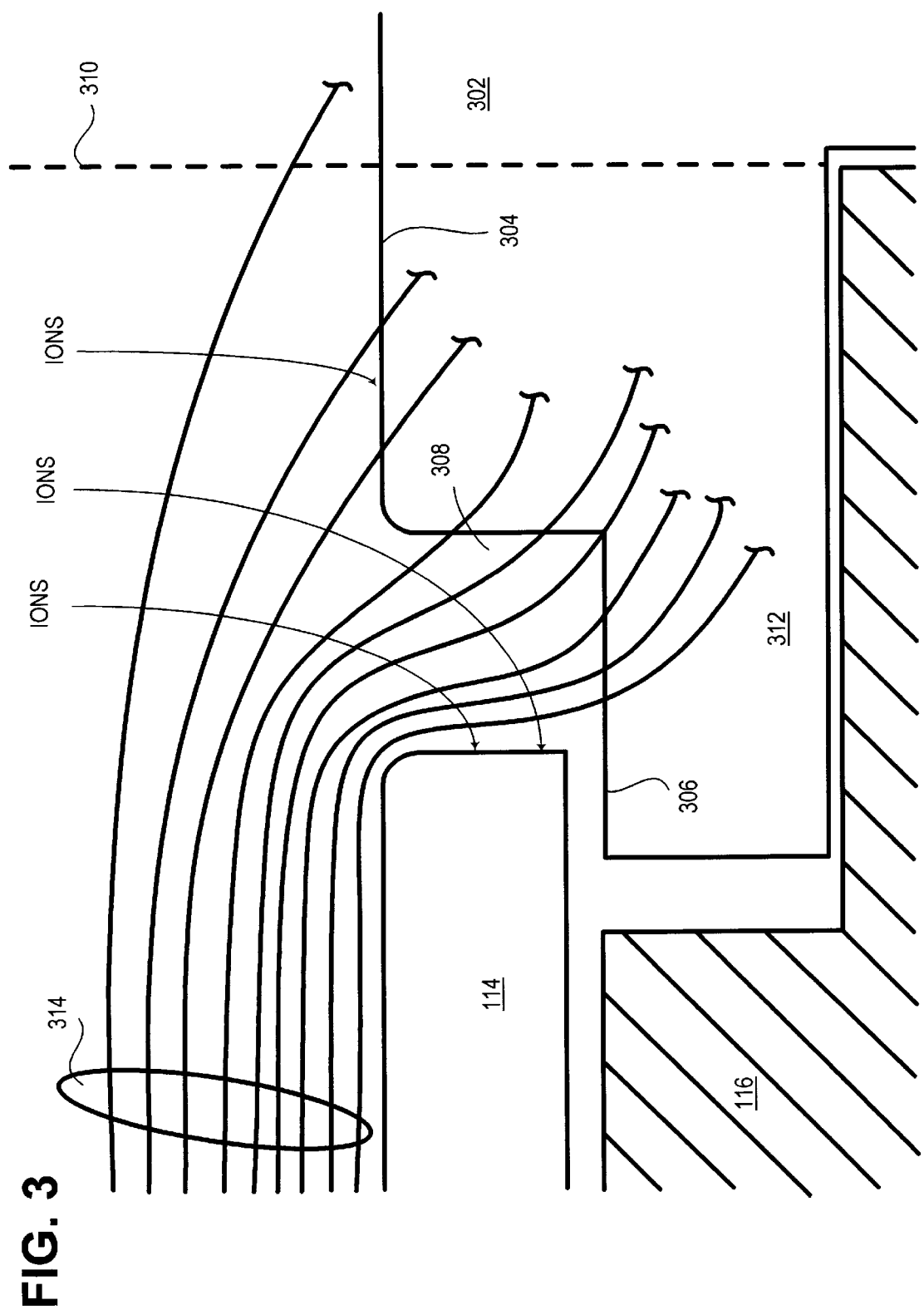
FIG. 3 depicts, in accordance with one embodiment of the present invention, a portion of the inventive focus ring which employs low dielectric constant inserts to increase the impedance between the chuck and the focus ring upper surface.

FIG. 3 illustrates, in accordance with one embodiment of the present invention, an improved focus ring design which advantageously modifies the contours of the equipotential field lines during plasma processing, thereby reducing the impact with which ions in the plasma sheath impinge upon the upper and lower horizontal surfaces of the focus ring. Referring now to FIG. 3, substrate 114 and chuck 116 are again shown. Focus ring 302 represents a focus ring whose shape is substantially similar to that of focus ring 124 in FIG. 2. It should be appreciated that in a specific system, the specific shape of focus ring 302 may vary depending on the arrangement of chuck 116, substrate 114, and/or others. Therefore, the exact shape of focus ring 302 of FIG. 3 is shown for illustration purposes only and is not limiting in anyway.

Focus ring 302 preferably has an upper surface 304 which is exposed to the plasma environment during plasma processing. Focus ring 302 further includes a lower surface 306, which underlies both substrate 114 and a gap 308 (between substrate 114 and focus ring 302) during plasma processing. As shown in FIG. 3, a portion of focus ring 302 overlaps chuck 116 (i.e., the portion of focus ring 302 that is to the left of dashed line 310). It should be understood that this chuck overlapping portion substantially surrounds substrate 114 when viewed from the top of the substrate 114.

In accordance with one embodiment of the present invention, at least part of chuck overlapping portion 312 is constructed such that impedance is increased between chuck 116 and upper surface 304 of focus ring 302. As mentioned earlier, the increased impedance results in a greater voltage drop between chuck 116 and upper surface 304, thereby lowering the potential difference between upper surface 304 of focus ring 302 and the overlying plasma sheath. The increased impedance in chuck overlapping portion 312 also causes the contour of the equipotential field lines to bend toward chuck 116 in gap 308 in a generally downwardly direction away from upper surface 304.

When the contour of the equipotential field lines is so changed, there are fewer equipotential field lines above upper surface 304, and ions from the plasma region acquire less energy before impinging upon upper surface 304. The bending of the equipotential field lines (shown in FIG. 3 as equipotential field lines 314) also causes any ions entering gap 308 to be directed towards the edge of substrate 114 (since ions accelerate across equipotential field lines in a direction generally orthogonal to the field lines). Accordingly, fewer ions impinged on lower surface 306, and any ions impinging thereon generally does so with less energy compared to the situation in prior art FIG. 2.

In one embodiment, the impedance between chuck 116 and upper surface 304 of focus ring 302 is accomplished by forming at least part of chuck overlapping portion 312 of focus ring 302 out of a material that has a lower dielectric constant than the prior art focus ring (which is typically made up of aluminum oxide $Al_2O_3$). In one embodiment, focus ring 302 may be made up of quartz or any type of plastic material that can withstand the plasma etch environment. It should be pointed out that the use of plastic materials in focus ring 302 in a plasma etch environment is not favored in the prior art due to particulate contamination concerns. With reduced erosion of focus ring 302 along upper surface 304 and lower surface 306, the particulate contamination concern is alleviated, thereby facilitating the use of versatile plastic materials such as polyimid (one commercial embodiment of which is known as Vespel by the Dupont™ Chemical Company or polyimid.

It is contemplated that the entire focus ring 302 may be made of the lower dielectric constant material or only a portion of focus ring 302, e.g., chuck overlapping portion 312, may be made out of the lower dielectric constant material. Of course the impedance between chuck 116 and upper surface 304 may also be increased by forming only part of chuck overlapping portion 312 out of the lower dielectric constant material. For example, any portion to the left of dashed line 310 may be formed of the lower dielectric constant material to achieve reduced erosion of the focus ring. In one example, focus ring 302 may be formed of a conventional focus ring material and insert(s) made of the lower dielectric constant material may be provided (e.g., either horizontally, vertically, or at an angle) within at least a portion of chuck overlapping portion 312. When the focus ring material is kept conventional and the insert is encapsulated therein, no new material is introduced into the chamber. Advantageously, extensive testing does not need to be conducted prior to using the improved focus ring.

Figure 4:
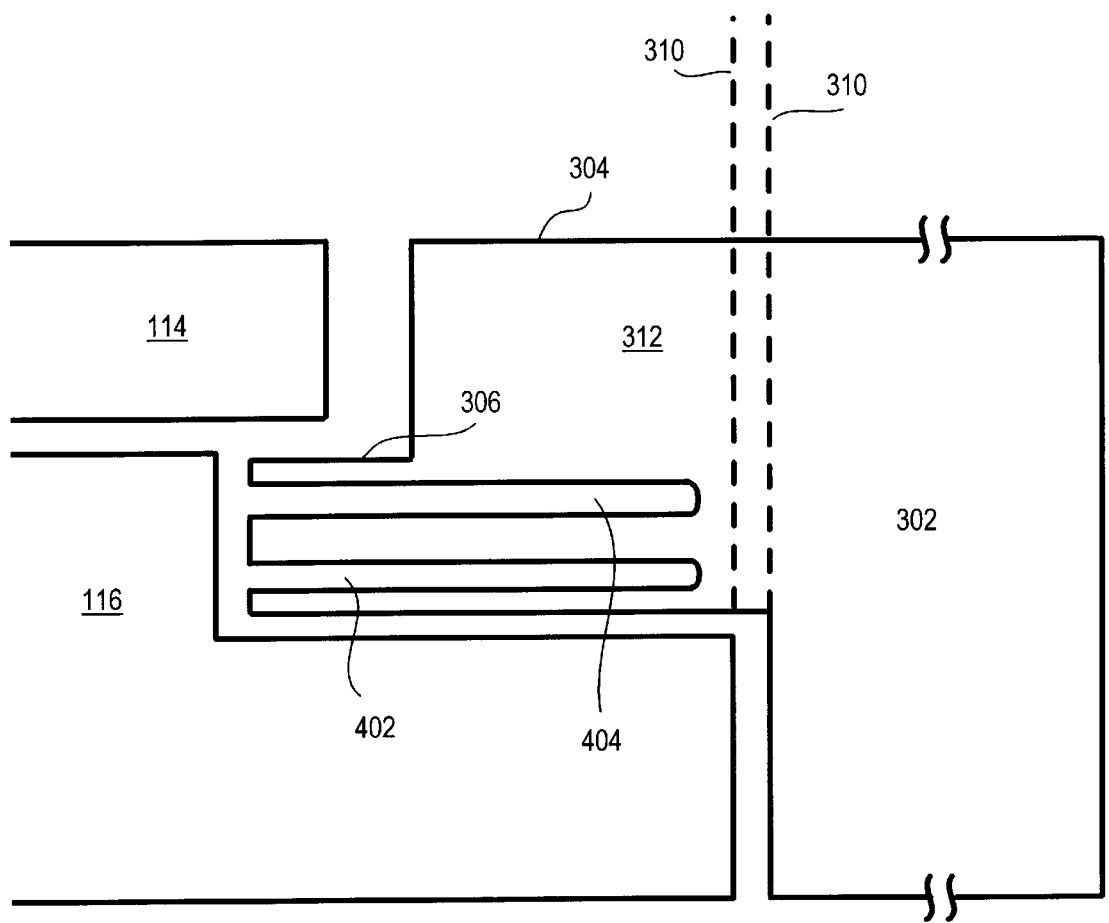
FIG. 4 illustrates, in accordance with another embodiment of the present invention, a portion of the inventive focus ring which employs gap(s) to increase the impedance between the chuck and the focus ring upper surface.

In one embodiment, the impedance between lower chuck 116 and upper surface 304 is created by providing one or more low dielectric constant regions, e.g., gaps, in chuck overlapping portion 312 of focus ring 302. FIG. 4 illustrates this embodiment wherein two gaps 402 and 404 are formed within chuck overlapping portion 312. Although FIG. 4 shows vacuum gaps 402 and 404 to be entirely within chuck overlapping portion 312, such gaps may extend beyond dash line 310 into focus ring 302 if desired. Further, the vacuum gaps may be disposed horizontally or at an angle with lower surface if desired and any number of gaps may be provided.

In general, the vacuum gap may have any size. Preferably however, the vacuum gap is dimensioned such that plasma could not ignite within the gap during plasma operation. Of course the exact size of the vacuum gap varies depending on the pressure within the plasma processing chamber during plasma processing and/or the amount of radio frequency (RF) power supply to chuck 116. By way of example, Paschen law may be employed to determine the dimension of the vacuum gap to ensure that no plasma ignition takes place within the vacuum gaps during plasma operation. Also, the number of gaps and their dimension should be determined with due consideration given to the structural, mechanical integrity of the focus ring.

Figure 5:
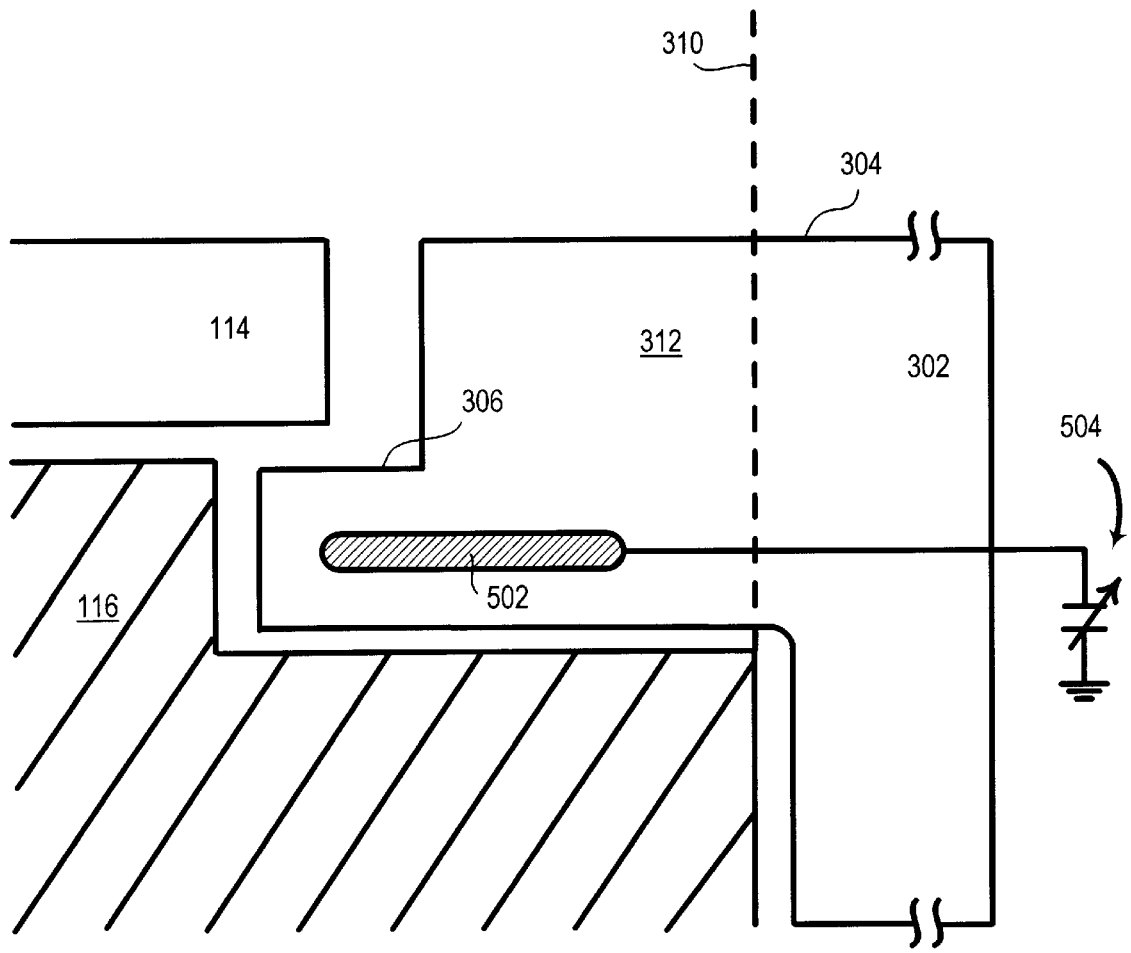
FIG. 5 illustrates, in accordance with another embodiment of the present invention, a portion of the inventive focus ring which employs grounded conductive insert(s) to increase the impedance between the chuck and the focus ring upper surface.

In accordance with another embodiment of the present invention, a conductive insert (i.e., a metal plate or ring) may be provided with the focus ring to change the contour of the equipotential field lines during plasma operation to achieve reduction in focus ring erosion. Referring now to FIG. 5, a conductive insert 502 is shown disposed within chuck overlapping portion 312 of focus ring 302. In the embodiment of FIG. 5, conductive insert 502 represents a metal ring or plate embedded within chuck overlapping portion 312 of focus ring 302 although conductive insert 502 may have any suitable shape. Further, conductive insert 502 may extend beyond dash line 310 into the remaining of focus ring 302 and may be disposed at any angle relative to lower surface 306, including parallelly. If desired, conductive insert 502 may be formed of substantially conductive polysilicon or any type of suitable substantially conductive material. Conductive insert 502 is preferably grounded through an RF blocking capacitor (shown in FIG. 5 by capacitor 504).

The presence of conductive insert 502 causes the equipotential field lines to bend away from upper surface 304 of focus ring 302, thereby reducing the number of equipotential field lines present above upper surface 304 (and concomitantly the impact with which ions impinge upon upper surface 304 and lower surface 306 of focus ring 302). Note that since the conductive insert may be substantially embedded within the focus ring, the focus ring itself may be formed of any material, including those selected primarily for compatibility with the process environment. This aspect of the invention is particularly advantageous since it permits the system designer a great deal of flexibility in specifying the material for use in focus ring construction and yet still permits focus ring erosion to be reduced. A conductive insert can also be designed to reduce polymer deposition by increasing ion impact to other areas of the focus ring.

Figure 6:
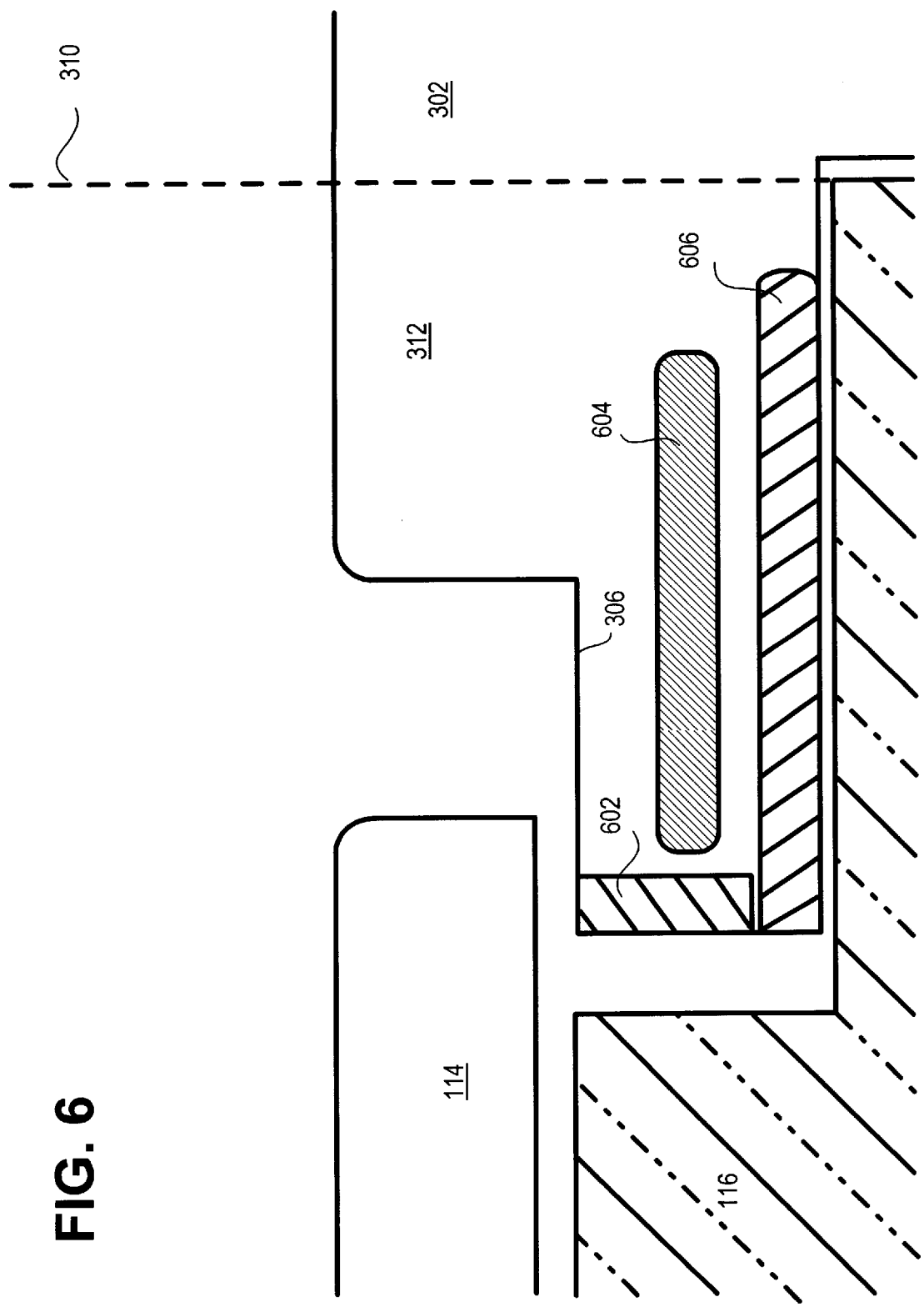
FIG. 6 illustrates, in accordance with another embodiment of the present invention, a portion of the inventive focus ring which employs multiple insert(s) to increase the impedance between the chuck and the focus ring upper surface.

FIG. 6 shows yet another embodiment of the present invention wherein multiple low dielectric constant layers are provided in at least part of chuck overlapping portion 312 to increase the impedance between chuck 116 and upper surface 304 of focus ring 302. In the embodiment of FIG. 6, three exemplary low dielectric constant inserts 602, 604, and 606 are shown. Multiple inserts are shown in FIG. 6 to illustrate that multiple horizontal, vertical, or angled low dielectric constant inserts may be provided to increase the impedance between chuck 116 and upper surface 304 and to reduce focus ring erosion.

If desired, any of inserts 602, 604, and 606 may be omitted or a greater number of inserts may be employee. By way of example, vertical inserts 602 may be omitted if desired, or vertical inserts 602 and 604 may be omitted, thereby permitting lower dielectric constant insert 606 to be encapsulated entirely within the focus ring material. When so encapsulated, the lower dielectric constant material is essentially protected from the process environment, which substantially increases the range of materials useable for the low dielectric insert. The encapsulation of the lower dielectric constant material inside the focus ring also permits the designer to specify, as mentioned earlier, focus ring material for purposes other than erosion reduction (i.e., the designer may specify that the remainder of focus ring 302 be formed of the prior art aluminum oxide material for process compatibility purposes).

As can be appreciated from the foregoing, the invention advantageously reduces focus ring erosion without requiring changes in chamber design (such as changes in the shape of or the relative position of chuck 116, substrate 114, and the like). By bending the equipotential field lines so that ions impinge the upper and lower surfaces of the focus ring with a substantially lower impacting force, focus ring erosion is substantially reduced, thereby lowering the level of particulate contamination within the plasma processing chamber and increasing the life of the focus ring.

As can be appreciated by those skilled in the art, lowering the level of particulate generation advantageously increases the mean time between cleans (MTBC), which advantageously decreases the cost of ownership for the owner of the plasma processing system. Further, erosion control is achieved even when the lower dielectric material, lower dielectric region, and/or conductive insert is entirely encapsulated within a focus ring whose material is selected for purposes other than focus ring erosion control (e.g., primarily for process compatibility reasons).

While this invention has been described in terms of several preferred embodiments, there are alterations, permutations, and equivalents which fall within the scope of this invention. By way of example, a given focus ring may be implemented with any combination of low dielectric constant portion (either low dielectric constant region such as gap or low dielectric constant insert) and/or grounded conductive insert of the described embodiments to achieve the desired degree of focus ring erosion reduction. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A focus ring configured for use in a plasma processing chamber, said focus ring also being configured to overlap at least a portion of a substrate-holding chuck that is powered by radio frequency (RF) power during plasma operation to act as an electrode, comprising:

an upper surface, said upper surface being exposed to a plasma region within said plasma processing chamber during said plasma operation; and a chuck overlapping portion, said chuck overlapping portion overlaps said portion of said substrate-holding chuck, a portion of said chuck-overlapping portion being formed of a first material having a lower dielectric constant than the rest of said chuck-overlapping portion.

2. The focus ring of claim 1 wherein said chuck overlapping portion comprises a plurality of inserts formed of said first material.

3. The focus ring of claim 1 wherein said chuck overlapping portion comprises an insert formed of said first material, said insert being disposed parallel said upper surface.

4. The focus ring of claim 3 wherein said insert is encapsulated within said focus ring such that said insert is not exposed to plasma in said plasma processing chamber.

5. The focus ring of claim 1 wherein said first material represents chamber vacuum and said chuck overlapping portion comprises a vacuum gap overlying at least a portion of said portion of said substrate holding chuck, said vacuum gap being dimensioned, responsive to an operating pressure and RF power setting of said plasma processing chamber during said plasma operation, such that plasma does not ignite within said vacuum gap during said plasma operation.

6. A focus ring configured for use in a plasma processing chamber, said focus ring also being configured to overlap at least a portion of a substrate-holding chuck that is powered by radio frequency (RF) power during plasma operation to act as an electrode, comprising:

an upper surface, said upper surface being exposed to a plasma region within said plasma processing chamber during said plasma operation; and a chuck-overlapping portion, said chuck overlapping portion overlaps said portion of said substrate-holding chuck, said chuck-overlapping portion comprising a conductive insert that overlies at least a portion of said portion of said substrate-holding chuck when said focus ring is installed in said plasma processing chamber.

7. The focus ring of claim 6 wherein said conductive insert is grounded.

8. The focus ring of claim 7 wherein at least a portion of said chuck-overlapping portion is formed of a first material having a lower dielectric constant than a remainder of said focus ring, said at least portion of said chuck-overlapping portion being different from said conductive insert and said remainder of said focus ring.

9. The focus ring of claim 8 wherein said first material represents chamber vacuum and said chuck overlapping portion comprises a vacuum gap overlying at least a portion of said portion of said substrate holding chuck, said vacuum gap being dimensioned, responsive to an operating pressure and RF power setting of said plasma processing chamber during said plasma operation, such that plasma does not ignite within said vacuum gap during said plasma operation.

* * * * *